United States Patent
Groeger et al.

(10) Patent No.: US 6,961,548 B2
(45) Date of Patent: Nov. 1, 2005

(54) METHOD FOR MASKING INTERRUPTIONS ON PLAYBACK OF RECEIVED RADIO SIGNALS

(75) Inventors: Klaus-Erwin Groeger, Diekholzen (DE); Ulrich Fricke, Nordstemmen (DE)

(73) Assignee: Robert Bosch GmbH, Stuttgart (DE)

( * ) Notice: Subject to any disclaimer, the term of this patent is extended or adjusted under 35 U.S.C. 154(b) by 227 days.

(21) Appl. No.: 10/182,411

(22) PCT Filed: Jan. 8, 2001

(86) PCT No.: PCT/DE01/00030

§ 371 (c)(1),
(2), (4) Date: Jan. 31, 2003

(87) PCT Pub. No.: WO01/56178

PCT Pub. Date: Aug. 2, 2001

(65) Prior Publication Data

US 2003/0153292 A1 Aug. 14, 2003

(30) Foreign Application Priority Data

Jan. 29, 2000 (DE) .......................................... 100 04 002

(51) Int. Cl.[7] ............................. H04B 1/18; H04B 1/16; H04B 1/10
(52) U.S. Cl. ................................ 455/161.1; 455/194.1; 455/185.1; 455/186.1; 455/161.3; 455/221; 455/223
(58) Field of Search .......................... 455/194.1, 161.1, 455/184.1, 181.1, 183.2, 185.1, 186.1, 161.3, 226.2, 230, 231, 218–223, 132–136

(56) References Cited

U.S. PATENT DOCUMENTS

| | | | | |
|---|---|---|---|---|
| 5,151,922 A |   | 9/1992 | Weiss ........................... | 375/217 |
| 5,222,254 A | * | 6/1993 | Verron et al. ............. | 455/186.1 |
| 5,390,343 A | * | 2/1995 | Rupprecht et al. ........ | 455/161.3 |
| 5,404,588 A | * | 4/1995 | Henze ....................... | 455/186.1 |
| 5,493,711 A | * | 2/1996 | Koyama ................... | 455/194.1 |
| 5,535,442 A | * | 7/1996 | Kishi ......................... | 455/184.1 |
| 6,385,440 B1 | * | 5/2002 | Shimmi .................... | 455/194.1 |

FOREIGN PATENT DOCUMENTS

| | | | | |
|---|---|---|---|---|
| DE | 44 21 694 | 1/1996 | ............ | H04B/1/06 |
| DE | 197 01 042 | 7/1998 | ............ | H04B/1/12 |
| DE | 197 39 396 | 3/1999 | ............ | H03J/5/00 |
| EP | 0 497 360 | 5/1991 | ............ | H01J/65/04 |
| EP | 0 591 655 | 4/1994 | ............ | H04H/1/00 |
| EP | 0 597 492 | 5/1994 | ............ | H04H/1/00 |
| EP | 0 497 115 | 5/1998 | ............ | H04H/1/00 |
| EP | 0 845 873 | 6/1998 | ............ | H04B/7/00 |

* cited by examiner

Primary Examiner—Duc M. Nguyen
(74) Attorney, Agent, or Firm—Kenyon & Kenyon

(57) ABSTRACT

A method of masking interruptions in the playback of received radio signals is provided, in which lengthy interruptions are allowed only when modulation of the radio broadcast program currently being received is recognized as speech, and a modulation pause in the received radio signal is detected. This method permits essentially complete masking of lengthy interruptions in playback or making them inaudible, in which these interruptions are necessary, e.g., for analysis/testing for a transmission frequency of transmitted RDS information to be used as an alternative to a transmission frequency currently being received.

12 Claims, 4 Drawing Sheets

METHOD FOR MASKING INTERRUPTIONS ON PLAYBACK OF RECEIVED RADIO SIGNALS

FIELD OF THE INVENTION

The present invention relates to a method of masking interruptions in playback of received radio signals or making them inaudible.

BACKGROUND INFORMATION

Modern radio receivers, for example, radio receivers intended for mobile use, such as car radios, permit automatic switching to an alternative transmission frequency which may be received better and on which the same program is transmitted. If an alternative transmission frequency is receivable at the receiver's location, a switchover is made if the reception of a radio transmission frequency currently being received deteriorates, e.g., due to increasing distance of the receiver's current location from the radio transmitter.

To perform the switchover, radio receivers may include a decoder for analysis of information transmitted over a received radio transmission frequency in addition to the actual audio broadcasting program. This information may be transmitted, for example, by the Radio Data System (RDS). This information may include, for example, lists of alternative frequencies (AF) over which the same program is transmitted, the transmission frequency currently being received, and program identification codes (PI), which permit unambiguous identification of a program transmitted on a received transmission frequency. A description of a Radio Data System is referred to, for example, in "Specifications of the Radio Data System for VHF/FM Broadcasting," European Broadcasting Union, Brussels, March 1984.

Before the radio receiver may switch from a radio transmission frequency currently being received to an alternative transmission frequency, e.g., on the basis of AF information, first the reception quality of the alternative transmission frequency should be tested. To do so, the radio receiver is tuned from the current radio transmission frequency to the alternative transmission frequency and the reception quality of the alternative transmission frequency is then determined, e.g., on the basis of the reception field strength or, e.g., on the basis of the error rate of the radio data signal, or on the basis of other criteria. If the reception quality of the alternative transmission frequency is better than that of the transmission frequency originally set, the alternative transmission frequency may be retained as the current transmission frequency. Otherwise, the radio receiver is tuned back to the transmission frequency originally set and/or additional alternative transmission frequencies are checked.

When switching from the current transmission frequency to an alternative transmission frequency, the reception quality of the alternative transmission frequency may not be known, e.g., the alternative frequency may have severe interference and the program may only be receivable with a high noise level. Also, the playback of the audio broadcast program transmitted over the set transmission frequency may be interrupted while the reception quality of the alternative transmission frequency is being checked. For simple tests, e.g., of only the reception field strength of the alternative frequency, the alternative frequency need be set only very briefly, i.e., in the range of a few milliseconds, so that an interruption of playback of the audio broadcast program may hardly be perceptible by a listener. For more complex tests, however, e.g., of the error rate of the radio data signal or the PI code of the alternative frequency, prolonged switching to the alternative frequency with correspondingly long playback interruptions in the range of at least a few tens of milliseconds up to a few hundreds of milliseconds may be necessary, these interruptions resulting from the time required for synchronization of the receiver to the RDS data stream and for analysis of the same. These interruptions may be audible and perceived as annoying by the listener, if suitable masking measures are not performed.

Various approaches have been researched and implemented, permitting switching to alternative reception frequencies without these interruptions being noticed.

European Patent No. 0 497 115 describes a radio receiver, which has a memory device for continuously receiving an audio broadcast program signal being played back. In the case of an interruption in playback of the audio broadcast program due to temporarily switching to an alternative radio broadcast signal for testing purposes, this interruption is masked by input of stored signal sections obtained from the audio broadcast program played back directly prior to the playback interruption.

European Patent Application No. 0 459 360 describes an RDS radio receiver having two receiving parts, a first receiving part tuned to a current radio broadcast frequency and the audio broadcast program transmitted on this radio broadcast frequency being played back. The second receiving part is tuned successively to alternative transmission frequencies for determining their reception quality, and the alternative transmission frequencies are stored in a list where they are sorted according to their reception quality. By constantly updating this list, the alternative frequency having the best reception may be inaudibly switched to, if a change in reception frequency becomes necessary because of a deteriorating reception of the current reception frequency.

German Patent Application No. 197 01 042 describes a method of analyzing RDS signals of an alternative transmission frequency to a radio transmission frequency currently being received, in which the radio receiver is switched by a high-speed phase locked loop from the current frequency to the alternative frequency within the duration of a single bit of the RDS signal, a data sample is taken from the RDS data stream of the alternative frequency, and finally, the radio receiver is switched back to the current transmission frequency. By repeated temporary switching and bit sampling, a section of the RDS signal of the alternative transmission frequency, which is sufficient for analysis, is input. The brevity of switching to the alternative transmission frequency and of the playback interruption associated with it result in these interruptions being largely inaudible. Since the samples taken are only fractions of the duration of an RDS data bit, they are sensitive to interference due to disturbances in reception. Therefore, a plurality of sections may be input and a largely interference-free section of the RDS signal of the alternative transmission frequency may be obtained by averaging.

German Patent Application No. 197 39 396 describes a modification of this procedure in that, in the case of temporary switching to the alternative transmission frequency, a plurality of directly successive bits of the RDS signal are input. This results in increased reliability of the input RDS data at the expense of longer playback interruptions, as well as longer periods of time for input of a section of the RDS signal sufficient for analysis, because the lengthier switchings need not be performed in direct succession to not be perceived as interfering.

SUMMARY

An exemplary method according to the present invention for masking interruptions in playback of received radio signals is characterized in that lengthy interruptions are allowed only when modulation of the currently received radio program is recognized as speech, and a modulation pause is detected in the received radio signal.

It is believed that this method has the advantage in that interruptions in playback of a received radio program for time-consuming checking of alternative transmission frequencies or other measures are performed only during lengthy pauses in the radio broadcast program, and thus they may be inaudible, without complex circuitry. At the same time, information transmitted on alternative transmission frequencies may be rapidly and reliably determined.

Another exemplary embodiment of the present invention analyzes an identifier characterizing speech contributions for recognition of speech. This permits simple determinations of speech contributions, without requiring otherwise complicated analyses, such as frequency analysis or pause duration recognition. With respect to pause duration recognition, for example, pauses may: be immediately used for playback interruptions, so no pauses need be sacrificed for pause duration recognition in advance.

Another exemplary embodiment according to the present invention is characterized in that the identifier is the music/speech identifier (M/S) transmitted via the Radio Data System (RDS). This is dynamically managed by radio transmitters broadcasting the programs, so that even speech contributions within music contributions as well as music contributions within speech broadcasts are identified as such.

A modulation pause may be detected on the basis of a drop in modulation level below a specified threshold value. The threshold value may be fixed at a level below a minimum AF level, which is conventional for speech signals, yet above a noise level, so that quiet speech is not misinterpreted as the modulation pause and noise, which may result, for example, from sub-optimum reception conditions, is not misinterpreted as useful modulation. The threshold value may also be dynamically shifted to higher or lower values, for example, due to quiet useful modulation passages, high noise levels, or signals indicating poor reception. This permits better adaptation of modulation pause recognition to variable reception conditions.

In still another exemplary embodiment of the present invention, an interruption of a received radio signal in playback is canceled when the end of a modulation pause is recognized. Although this procedure may be more susceptible to interference than a Fixed interruption duration, it permits complete utilization of modulation pauses having an above-average length for playback interruptions.

The end of a modulation pause may be ascertained on the basis of the increase in the modulation level above a specified threshold value.

According to yet another exemplary embodiment of the present invention, the interruption and playback is ended after the activities performed during the interruption end. This may avoid unnecessarily long playback interruptions. This exemplary embodiment may also be combined with a termination in the playback interruption due to expiration of the set time of a timer or due to recognition of the end of a modulation pause, so that the termination is either initiated with the end of the activities to be performed during the playback interruption or on expiration of the set time of the timer or detection of the end of the modulation pause, whichever event occurs earlier.

DETAILED DESCRIPTION

According to the RDS specification described above, additional digital information is transmitted on a radio transmission frequency in addition to the actual program signal. This additional information is combined into groups, depending on the different types of information content to be transmitted. The groups may be broadcast repeatedly or as a continuous data stream having a variable information content at a data rate of, for example, 1187.5 bits per second.

Figure 1:
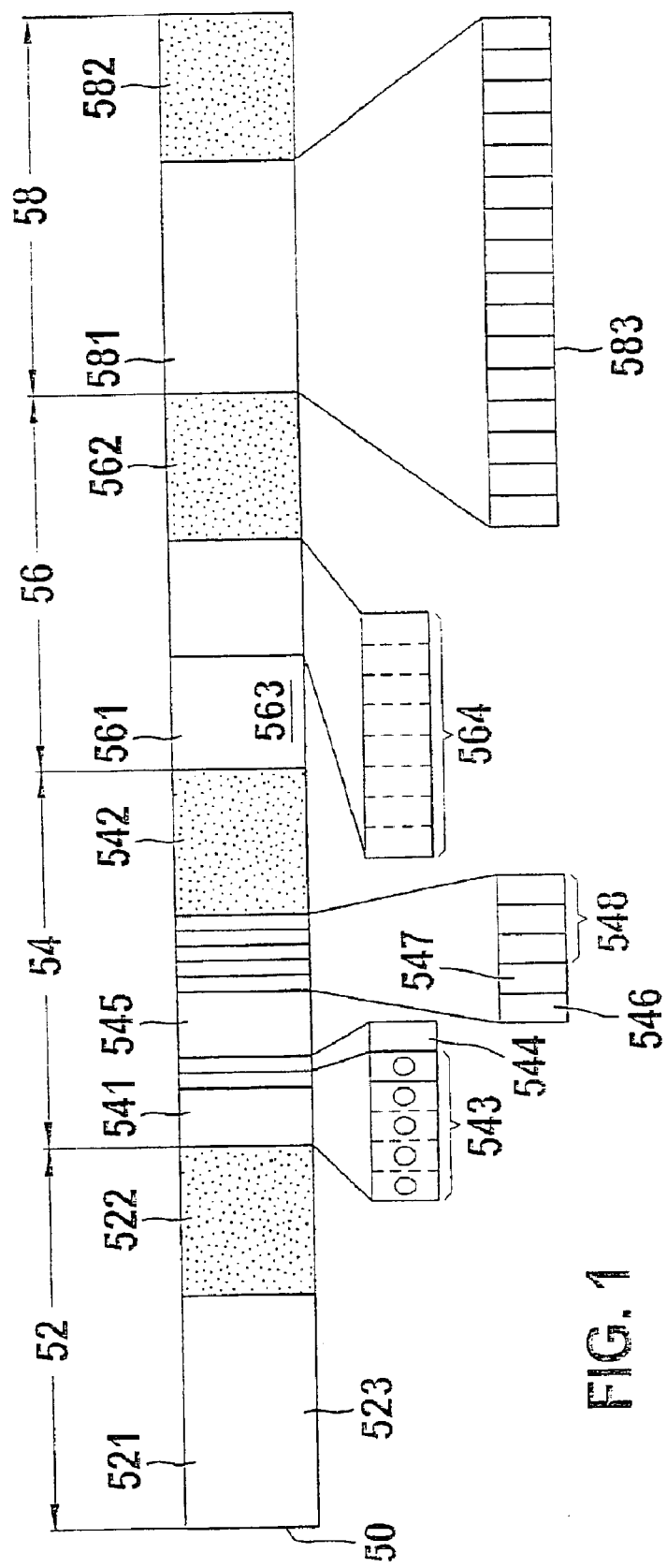
FIG. 1 is a diagram showing detail of an RDS signal within an RDS group.

FIG. 1 is a diagram showing detail of an RDS signal within an "0A" type RDS group. A group 50 includes four blocks 52, 54, 56, 58, each having 26 bits. The first sixteen bits of each block form information word 521, 541, 561, 581 containing the actual information, and the last ten bits form a combined test and offset word 522, 542, 562, 582. The test word is used for error recognition and correction, and the offset word is used for block synchronization of the receiver. All types of groups have the structure of first block 52 in common, the information word 521 of which is formed by program identification code (PI) 523, a unique identifier of a certain radio broadcast program. Block 2 of group "0A" contains a five-bit identifier 543 of the group type plus a one-bit traffic program identifier (TP=traffic program) 544, the value of which indicates whether the current radio broadcast program is a program that usually broadcasts traffic messages, a five-bit identifier 545 characterizing the type of program (PTY=program type), a one-bit announcement identifier (TA=traffic announcement) 546 characterizing current traffic information, a one-bit music/speech identifier (M/S) 547 indicating whether music or speech is being broadcast, and additional contents 548. Block 3 of group "0A" includes data 463, 464 of the above-mentioned AP lists of 2×8 bits. Information word 581 of block 4 is formed by program name (PS=program service name) 483, which is provided for display on a display screen of the radio receiver.

As described above, two types of interruptions in playback of a received radio broadcast program, which differ essentially in their duration, may be differentiated between. A first type of interruption, which may be used, for example, for checking the reception field strength of an alternative transmission frequency, is characterized by a comparatively short interruption duration in the range of a few milliseconds. This results from switching the receiver from the current frequency to the alternative frequency, testing the reception field strength of the alternative reception frequency, and switching back from the alternative reception frequency to the current reception frequency. This first form of playback interruption may not be disturbing due to its brevity, for example, when the interruption occurs in intervals that are large compared to their duration.

A second type of interruption is characterized by a longer interruption duration in the range of a few tens of milliseconds to a few hundreds of milliseconds. This interruption may result, for example, when analyzing the RDS data stream of an alternative transmission frequency. For example, the duration of a single group of RDS signals, which may be received repeatedly for reliable analysis of the PI code, for example, to reliably identify the program broadcast over the alternative transmission frequency, may be approximately 87.6 milliseconds at the data rate described above. This second type of playback interruption may be perceptible due to its length, in the absence of suitable masking measures. Therefore, the interruption may be disturbing.

An exemplary embodiment according to the present invention implements interruptions in playback of a received radio broadcast program, e.g., for analysis of information of the radio data signal of a transmission frequency, which is an alternative to the radio transmission frequency currently being received, but does so only when the radio broadcast program to be played back has a pause at that point in time, so that the interruption may not be inaudible and may not be disturbing.

Although the beginning of a modulation pause may be discernable, the length of the modulation pause may not be determinable in advance. In the case of music signals, it may be difficult to differentiate between modulation pauses and quiet passages.

Investigations on actual radio broadcast program signals have shown that modulation pauses in speech contributions may be reliably discernable as modulation pauses, since very low levels, which may be misinterpreted as modulation pauses, such as those that occur in very quiet music passages, may not occur in speech signals, and since modulation pauses in speech signals last a relatively long period of time in comparison with pauses in music signals, usually with a duration in the range of approximately 300 to 600 milliseconds. Therefore, there has been an attempt to combine modulation pause recognition with speech recognition to form a speech pause recognition, wherein speech pauses my be used for longer interruptions in playback. For recognition of speech contributions, for example, the MIS bit transmitted as part of the radio data signal may be analyzed. In the case of a speech contribution, the M/S bit assumes a first value, e.g., logic "0." In the case of a music contribution, the M/S bit assumes a second value, e.g., logic "1."

Figure 2:
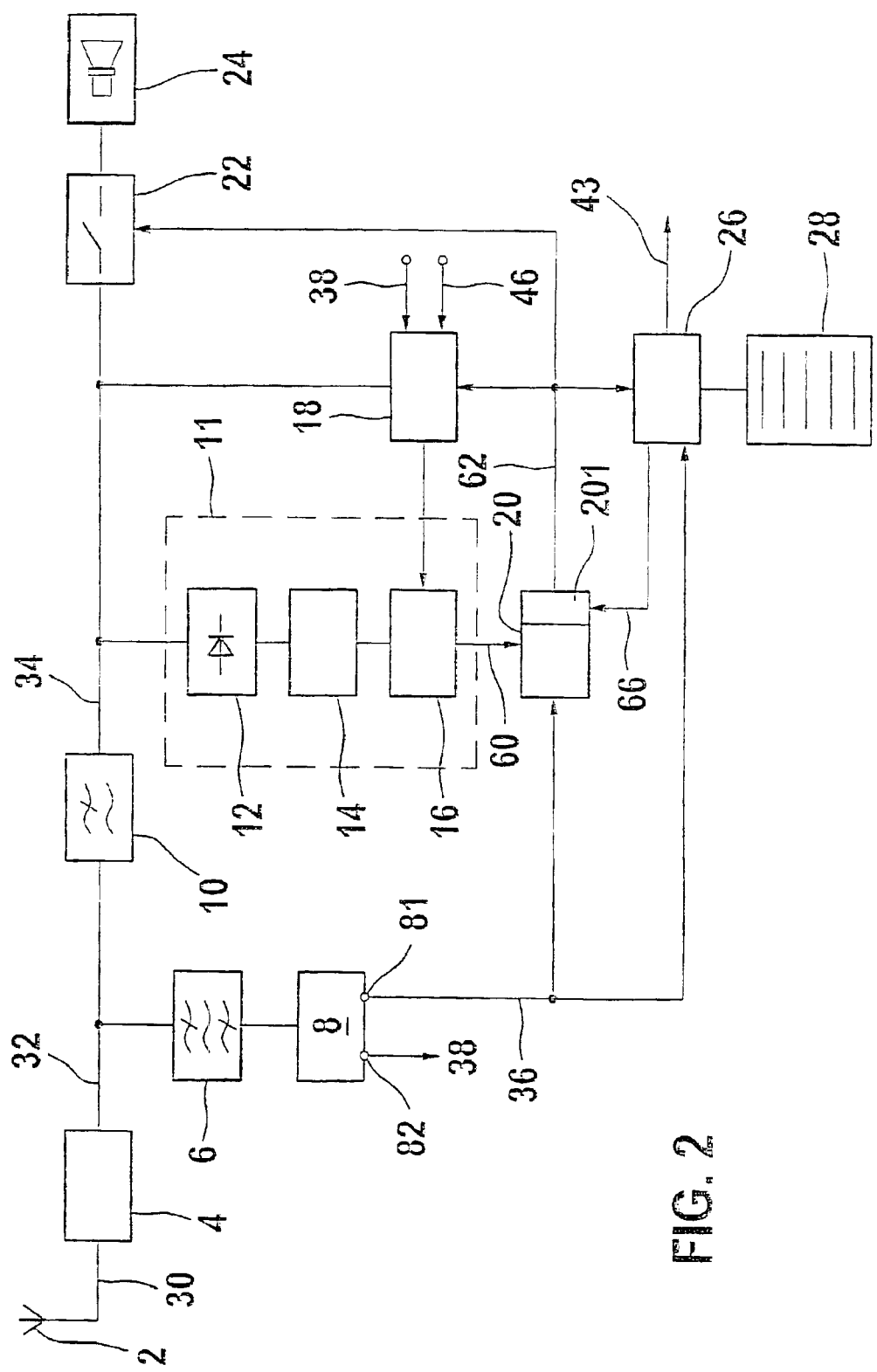
FIG. 2 is a block diagram showing an RDS radio receiver having exemplary parts according to the present invention for implementing an exemplary method according to the present invention.

FIG. 2 is a block diagram showing an RDS radio receiver having exemplary parts according to the present invention for implementing an exemplary method according to the present invention.

Figure 2A:
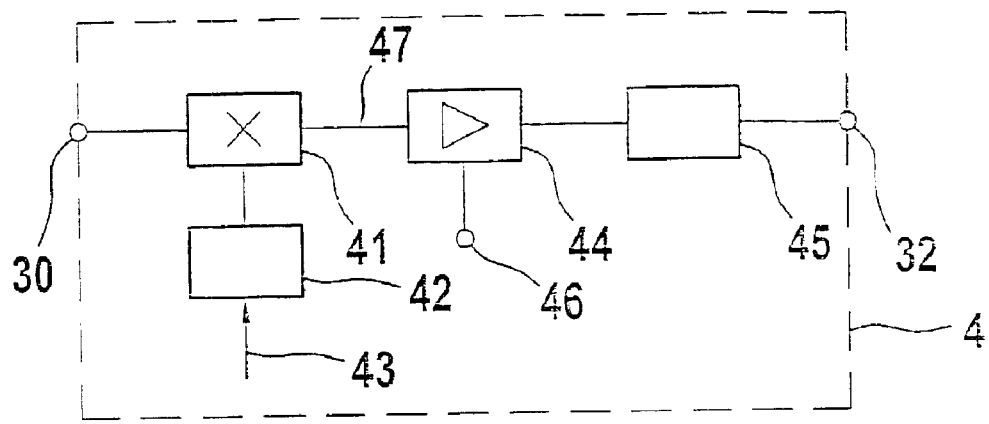
FIGS. 2*a* through 2*c* are block diagram showing modules of the exemplary radio receiver according to the present invention shown in FIG. 2.

Receiving antenna 2 of the radio receiver receives frequency-modulated signals 30 of one or more radio transmitters and radio transmission frequencies. These signals are sent to receiving part 4, which is connected to receiving antenna 2. Receiving part 4 is operable to select one of the plurality of receivable radio transmission frequencies and demodulation thereof. Described below with reference to FIG. 2a is a detailed description of receiving part 4.

The receiving part 4 includes an oscillator that sends an oscillation signal to a mixer 41 via a phase locked loop (PLL) 42, mixer 41 also receiving antenna signal 30 The PLL circuit 42 contains a controllable divider, and the operation of tuning to a certain radio transmission frequency is performed by controlling the divider ratio of the divider. The divider ratio of the divider is controlled via a reception frequency control signal 43 of a control unit, as described below. The antenna signal is transformed through a suitable adjustment of the divider ratio and the mixing frequency to an IF level, for example, to 10.7 MHZ. This IF signal 47 is sent via an IF amplifier 44 to a frequency demodulator 45 for demodulation of the frequency-modulated IF radio reception signal. At the output of FM demodulator 45, which forms the output of receiving part 4, stereo multiplex signal 32 may be received as the modulation content of received radio signal 30. IF amplifier 44 has another output, at which a field strength signal 46 may be received, which indicates the reception field strength of the received radio signal.

Figure 2B:
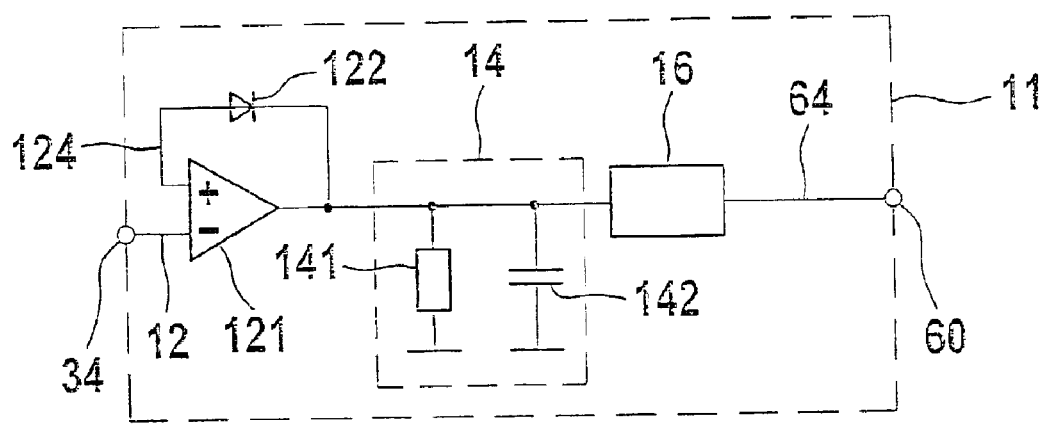
Figure 2C:
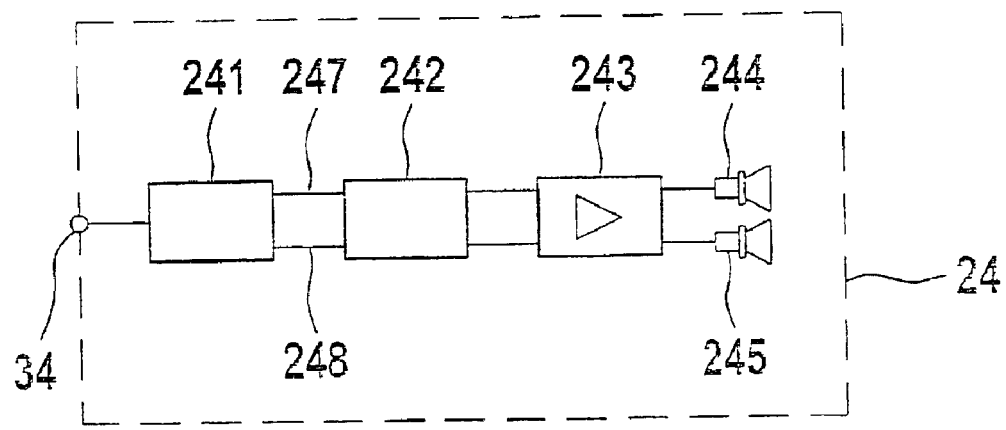

Stereo multiplex signal 32, which appears at the output of receiving part 4 also contains, in addition to the actual radio broadcast program signal to be played back, the RDS information modulated onto, for example, a 57 kHz auxiliary carrier. MPX signal 32 is sent to a low-pass filter 10, which outputs audio signals 34 to be played back via the output AF. These signals are sent via a controllable switch 22 to a playback device 24 for interruption of playback of a received radio broadcast program, the playback device 24 being operable to playback the audio signals supplied to it. The playback device 24 is described below with reference to FIG. 2c.

AF signal 34 to be played back is sent to a stereo decoder 241, which links the composite signal contained in the stereo multiplex signal for the right and left audio channels to the stereo differential signal modulated onto a stereo auxiliary carrier of, for example, the frequency 38 kHz to form the audio signals for the right and left channels. The audio signals for the left and right stereo channels 247 and 248, which are available at the output of stereo decoder 241, are sent via a sound actuator 242 for influencing the sound, e.g., as an equalizer for frequency-selective amplification/damping of signals and via an AF amplifier 243 to loudspeakers 244, 245 for playback.

MPX signal 32 is also sent to a 57 kHz bandpass filter for isolation of the RDS signal from the MPX signal. The 57 kHz auxiliary carrier modulated with the RDS signal is sent to an RDS decoder 8 to obtain the RDS signal by demodulation of the 57 kHz auxiliary carrier, for synchronization with the RDS data stream and for obtaining certain information from the RDS data stream. After analysis of the RDS data stream contained in the MPX signal, M/S bit 36 transmitted over the currently received radio transmission frequency as part of the RDS signal output at a first output 81 of the RDS decoder, indicating the transmission of a speech contribution (M/S=0) or a music contribution (M/S=1) depending on its current value. At second output 82 of the RDS decoder, a signal 38 indicates the data error rate of the RDS signal transmitted on the radio frequency that is being received.

AF signal 34 available at the output of low-pass filter 10 is also sent to a modulation pause recognition unit 11, which is operable to recognize modulation pauses. Modulation pause detection unit is described below with reference to FIG. 2b.

Modulation pause detection unit includes an AF level detector 12 and a threshold value comparator 16. In this exemplary embodiment according to the present invention, the AF level detector is an AF envelope curve detector and includes an operational amplifier 121, the inverting input of which receives the AF signal. The output of operational amplifier 121 is connected to the non-inverting input of the operational amplifier across a diode 122 polarized in the blocking direction. The output signal of level detector 12, which indicates the AF level, is sent to a threshold value comparator 16, which compares the signal representing the AF level to a specified threshold value. If the AF signal level drops below the specified threshold value, a modulation pause is presumed, and threshold value comparator 16 generates a signal 60 indicating a modulation pause.

Threshold value 64, specified for threshold value comparator 16, may be preselected to a fixed value and may be, for example, a value below the minimum AF level usually occurring with speech signals but above "0," to avoid misinterpretation of quiet speech passages as a modulation pause and misinterpretation of noise in the AF signal as a speech signal.

According to yet another exemplary embodiment of the present invention, a threshold value calculation unit 18 calculates the threshold value. In another exemplary embodiment according to the present invention, the threshold value is determined from AF signal 34 obtained from the received radio signal. For this purpose, AF signal 34 is sent to a first input of threshold value calculation unit 18, and a control signal 62, which controls switch 22, is sent to a second input of threshold value calculation unit 18. The threshold value calculation is performed, so that the AF level, which is greatly influenced by noise due to suboptimal reception conditions during modulation pauses, is determined when a control signal 62, indicating a speech pause is applied. The AF level is also determined when a signal indicating modulation is applied. The method of determining the level as described above may be performed by analogy, for example, by level detection 12. Minimum levels of a modulation section and maximum levels of a modulation pause are stored in a memory in threshold value calculation unit 18, and the threshold value may be defined, for example, as the geometric mean of the two level values thus stored.

As an alternative, a predetermined level may be provided to be shifted on the basis of level measurements toward higher values, e.g., when there is severe noise, or toward lower values, e.g., when there are very low speech signal levels.

Still another exemplary embodiment according to the present invention determines or shifts threshold value 64 as a function of signals indicating the reception quality of the current radio transmission frequency. In this case, it is presumed that higher noise levels prevail with poor reception as compared with good reception. For example, the signals indicating the reception quality may include field strength signal 46, which may be received by IF amplifier 44, and an RDS error rate signal 38, which indicates the RDS error rate and is output at a second output 82 of RDS decoder 8. One or both of these signals may be used, for example, to raise the threshold value when the field strength is low and/or when the RDS error rate is high, and high expected noise levels and AF levels, which differ from zero in modulation pauses.

In another exemplary modulation pause detection unit according to the present invention, the latter includes a low-pass filter 14 situated in the signal path between AF level detector 12 and threshold value comparator 16. The low-pass filter 14 is composed of a resistor 141, which is connected between the output of AF level detector 12 and common reference potential, and a parallel-connected capacitor 142. The low-pass filter prevents the modulation pause detection unit from responding to short-term fluctuations in level or to interference pulses 341 of AF signal 34, e.g., due to a noisy reception signal, so that modulation pause detection and/or speech pause recognition is reliably guaranteed, or at least made more probable, even when radio signals are noisy and/or when radio signals are received with weak reception.

Output signal 60 of modulation pause detection unit 11 indicating a modulation pause is sent to a first input of a switch control 20, the second input MIS bit 36 of which is applied and which links output signal 60 of modulation pause detection unit 12 to M/S bit 36 to form a switch control signal 62 for driving controllable switch 22 in the AP signal path to interrupt the playback of a received radio broadcast program. This linkage is implemented so that, when a speech signal is recognized, e.g., when the M/S bit assumes the first given value of "0" and a modulation pause is recognized, switch control signal 62 opens controllable switch 22 to interrupt the current playback.

In yet another exemplary embodiment according to the present invention, switch control signal 62 keeps switch 22 open for a specified period of time, such as 300 milliseconds, after the switch has been opened, since it has been determined that a speech pause in a speech contribution lasts at least 300 milliseconds. The specified period of time may be controlled, for example, by a timer, the sequence of which, namely a signal 60 indicating a modulation pause, is started. The timer may be started again only when its set time has previously completely elapsed. Finally, switch control signal 62 closes switch 22 after the specified period of time has elapsed, or switch control signal 62 keeps switch 22 closed when a music signal is recognized and/or there is no modulation pause.

This exemplary embodiment according to the present invention is characterized in that even high noise levels in AF signal 34, due to poor reception of the radio transmission frequency currently being received, which may be recognized as modulation by modulation pause detection unit 11, may not have the effect of premature termination of the playback interruption.

In still another exemplary embodiment according to the present invention, switch control signal 62, when a music signal is recognized and/or there is no modulation pause and/or the end of a modulation pause is recognized by modulation pause detection unit 11 on the basis of the increase in the AF level above threshold value 64, closes controllable switch 22 or keeps it closed, depending on the current state, for playback of the received radio signal.

It is believed that an advantage of this embodiment is the flexible control of the playback interruption periods as a function of an actual speech pause duration, so that periods of time longer than the minimum of 300 ms, for example, may, for example, be used for alternative frequency tests or other operations requiring an interruption in playback.

The exemplary embodiments of the formation of switch control signal 62 described above concern the formation of a switch control signal 62 for longer interruptions, e.g., the second type of interruptions described above. In addition, switch control signal 62 may also be generated by the control unit for short interruptions, i.e., a first type of interruptions, regardless of the current value of M/S bit 36 and output signal 60 of modulation pause detection unit 11. As an alternative, switch control signal 62 may also be generated for short interruptions on the basis of the output of modulation pause detection unit 11 alone, for example, so that switch control signal 62 generates a playback interruption for a second very short specified set time of a second timer of 8 milliseconds, for example, when modulation pause detection unit 11 indicates a modulation pause in a music signal.

An enable circuit 201, controlled by an enable signal 66 of the device control unit described below, is provided at the output of the switch control. Enable circuit 201 is designed so that in the event of an enable signal, the output of switch control signal 62 to switch 22 is enabled, but it is suppressed when there is no enable signal 66. With a corresponding generation of enable signal 66 by the control unit, the enable circuit causes an interruption in playback of a currently received radio signal to occur only when tests that require muting are initiated by the control unit.

Enable circuit 201 in combination with an appropriately generated enable signal 66 is also used according to another exemplary embodiment according to the present invention for premature termination of a playback interruption when an activity to be performed during a playback interruption, e.g., the PI check of stored alternative frequencies, is concluded before the end of the modulation pause or before the set time of the first timer has elapsed. Likewise, a playback interruption of the second type, i.e., a brief playback interruption, may also be terminated prematurely if the activity to be performed during the playback interruption requires a shorter period of time than the set time of the second timer. Therefore, this exemplary embodiment limits the playback interruptions to the periods of time actually required for the activities to be performed during the playback interruptions.

Finally, the radio receiver includes a device control unit 26 for controlling the functions of the radio receiver. Reception frequency control signal 43 may be received at an output of the device control unit and may be used to determine the divider ratio of the divider of the PLL for tuning the radio receiver to a certain radio transmission frequency.

Reception frequency control signal 43 may be generated by a user input at an input unit (not shown), e.g.,

- by specifying a specific radio transmission frequency or by selection of a certain radio program, the frequency data of which is stored in a memory 28 connected to device control unit 26,
- by device control unit 26 automatically in the case of deteriorating reception, of a radio transmission frequency currently being received for tuning to an alternative frequency, which is received better, on the basis of alternative frequency data stored in the frequency memory,
- by device control unit 26 for short-term temporary switching to an alternative radio transmission frequency as an alternative to the radio transmission frequency currently being received on the basis of alternative frequency data stored in the frequency memory,
- by the device control unit for continuously varying the current reception frequency to control a transmitter search run over the radio broadcast frequency band, e.g., between 87.5 MHz and 108.0 MHz in, for example, Europe.

Device control unit 26 also generates enable signal 66, which controls enable circuit 201 of switch control 20 when a switch to an alternative frequency for testing purposes or a transmitter search run through the radio transmission frequency band is prompted by control unit 26, and which according to an exemplary embodiment of the present invention is limited in time to the actual duration of an activity to be performed during the playback interruption.

Device control unit 26 also receives switch control signal 62, so that device control unit 26 may synchronize the initiation of PI tests, for example, of alternative frequencies or other activities with the occurrence of speech pauses in the received radio signal.

In addition, signal 36, indicating the state of the M/S bit transmitted over the radio transmission frequency currently being received, is also sent to device control unit 26. On the basis of M/S bit signal 36, device control unit 26 determines the type of tests that may be performed, depending on the type of playback interruptions that are possible according to the value of the M/S bit, i.e., the presence of a music or speech contribution.

Figure 3:
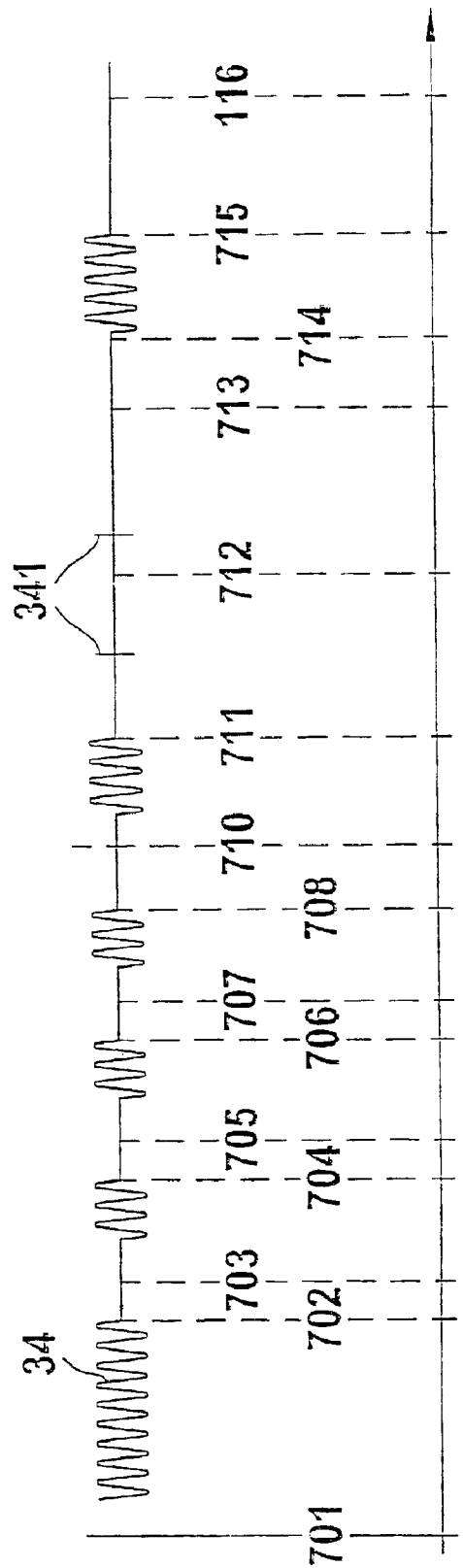
FIG. 3 is a diagram showing an exemplary sequence of an exemplary method according to the present invention.
Figure 3:
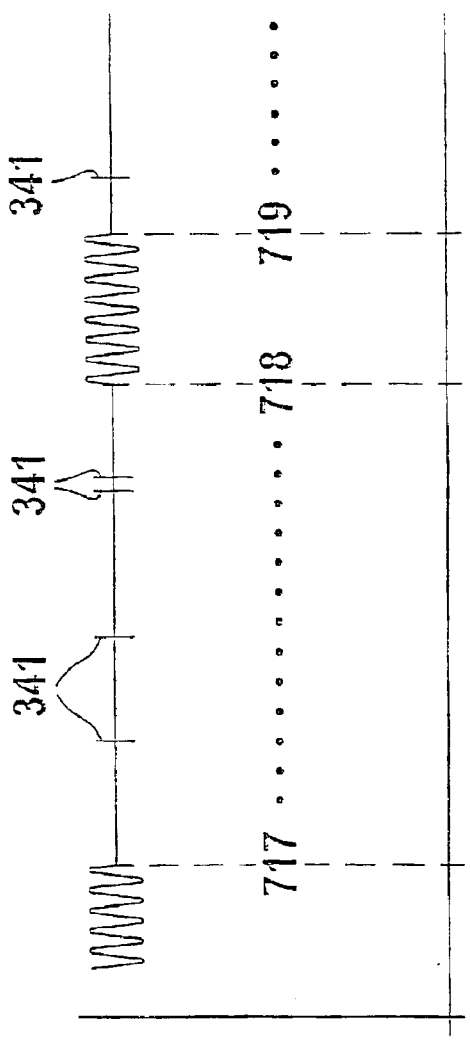

An exemplary method according to the present invention and the functioning of an exemplary radio receiver according to the present invention are described below with reference to the chronological sequence shown in FIG. 3.

For example, the radio receiver is turned on at a time 701 and tuned to a certain radio transmission frequency, hereinafter referred to as the current frequency. A piece of music is transmitted over the received radio transmission frequency, so that M/S bit 36 contained in the RDS signal, which is also transmitted over the radio transmission frequency, has the second value "1" indicating a music broadcast. In the case of modulation pauses recognized in the current program signal, it may not be known that these are actually modulation pauses or whether they are low-level signal sections. Therefore, a lengthy interruption in playback is suppressed. Alternatively, however, brief interruptions in the range of less than, for example, 8 ms, are allowed. Thus, at times 702, 704 and 706, modulation pauses are detected in the received radio signal. The control program provides for testing of the alternative transmission frequencies stored in memory 28 (e.g., three alternative transmission frequencies) at this point in time. Thus, switch control signal 62 is enabled by enable signal 66, so that switch 22 is opened at times 702, 704 and 706, and playback of the radio signal is interrupted. On the basis of switch control signal 62, control unit 26 initiates, at any of times 702, 704, 706, tuning of the receiver to one of the alternative radio transmission frequencies as an alternative to the current transmission frequency, these alternatives being stored in memory 28 through corresponding control of the divider ratio by way of reception frequency control signal 43 according to the alternative frequency data stored in memory 28 and taken, for example, from the received lists of alternative frequencies, whereupon their reception quality or reception field strength is evaluated on the basis of field strength signal 46. Switching back to the current transmission frequency occurs after expiration of the set time of the second timer, i.e., after approx. 8 ms at times 703, 705, 707. In the case of an enable signal, which is limited in time according to an exemplary embodiment of the present invention, the interruption duration is limited to the period of time actually required for the AF test, which may be shorter than the set time of the second timer, namely approximately, for example, 8 ms. The alternative frequencies are then stored in memory 28 and ranked in order of their reception field strength.

The music playback ends at time 708, so that the modulation pause recognition unit again recognizes a modulation pause. However, the tests requiring a brief interruption, which is also possible during music contributions, are concluded first, so that enable circuit 201 is blocked by control unit 26 at the output of the switch control circuit.

At time 710, the M/S bit is switched to the value "0" at the transmission end, i.e., transmission of a speech contribution on the current transmission frequency is indicated. On the basis of the current value of the M/S bit, tests requiring a longer interruption of the playback are prepared in control unit 26; this is allowed only during speech pauses. In the this case, this is the test of the PI codes of the alternative frequencies stored in memory 28, sorted by the reception field strength. Therefore, enable signal 66 is generated for the switch control signal. At time 711, a modulation pause in the speech signal, i.e., a speech pause is detected, so that switch control signal 62, which is enabled by device control unit 26 for the tests, switches the playback to mute in the sense of a prolonged interruption. Receiving part 4 is tuned to the first alternative frequency to be tested, the RDS decoder is synchronized and the PI code contained in the RDS data stream is analyzed. In addition, generation of signal 38, which indicates the RDS error rate of the alternative frequency, is activated. After analysis of the first alternative frequency, receiving part 4 is similarly tuned at time 712 to the alternative frequency to be tested next, and finally, at time 713 it is tuned to the third alternative frequency stored in memory 28. At time 714 the end of a speech pause is ascertained on the basis of the increase in AF level 34 above the threshold value of threshold value comparator 16, so that the test of the third alternative frequency is terminated, and the playback interruption is terminated by corresponding switch control signal 62. Since the alternative frequency tests are not yet concluded at this point in time, the enable signal for enable circuit 201 is maintained at the output of switch control 20.

At time 715 a renewed decline in AF level 34 and the specified threshold value is detected by modulation pause detection unit 11. Since M/S signal bit 36 also indicates the transmission of a speech signal, signal 62 is generated for opening switch 22, and since enable signal 66 is also generated, it is applied at its control input for opening switch 22, whereupon renewed playback of the AF signal is interrupted. On the basis of switch control signal 62, at the beginning of the interruption in playback, control unit 26 generates a signal corresponding to the frequency value of the third alternative frequency stored in memory 28 to control the divider ratio of the divider of the PLL, so that the receiving part is tuned to this alternative frequency. After analysis of the third alternative frequency or the RDS information transmitted over it, in particular its PI code, at time 716 control unit 26 again generates a divider ratio corresponding to the value of the current transmission frequency and thus tuning to the previous current transmission frequency. At this time the required alternative frequency tests are concluded, namely the PI codes of the three stored alternative frequencies have been analyzed, so enable circuit 201 is blocked by a corresponding blocking signal 66. Thus the current playback interruption is ended, although a speech pause is still being detected on the basis of an AF level which is below the specified threshold value and a speech signal is recognized on the basis of the value "0" of the M/S bit. In addition, other recognized modulation pauses, in particular speech pauses, do not cause any playback interruptions.

The alternative frequencies stored in the memory are reserved as alternative frequencies to the current transmission frequency because of their PI code or, as in the case of the third alternative frequency, for example, they are discarded because the PI code detected during the playback interruption and during the AF test performed in the meantime deviates from the current transmission frequency.

For example, if it is found at a time 717 that too few or no alternative frequencies have been stored in memory 28 or those that have been stored are not worthy of reception because of inadequate reception quality, then control unit 26 initiates a transmitter search run through the radio transmission frequency band to search for frequencies broadcasting the same program, i.e., the same PI code, as the transmission frequency currently being received. Because of the trial tuning to a plurality of receivable frequencies under some circumstances in the radio frequency band searched, a transmitter search run including PI testing takes a relatively long time and may therefore only be distributed among a plurality of longer interruptions in playback, i.e., speech pauses.

After switch control signal 62 has been enabled by control unit 26, a speech pause is recognized, e.g., at time 716. Playback is switched to mute by the switch control signal and the transmitter search run is initiated. To do so, the device control unit controls successive incrementally altered divider ratios according to a successive increase in reception frequency of receiving part 4. Meanwhile, the radio receiver is successively tuned to all transmission frequencies which are within the reception frequency band and are receivable at the site of the receiver; their PI code is analyzed and stored in memory 28 as an alternative frequency in the event the PI code is the same as that of the current transmission frequency.

According to another exemplary embodiment according to the present invention, in the case of a PI code that does not correspond to the current radio frequency, the tested alternative frequency is stored under a different PI code which is possibly stored or, if no such code is stored, the alternative frequency is stored in the memory under its PI. In this manner, an image of the transmitter landscape found at the receiver site is stored in frequency memory 28 as part of the transmitter search run.

At a point in time 718, e.g., after 500 ms, modulation pause detection unit 11 detects the end of the modulation pause so that the current stage of the transmitter search run is terminated by control circuit 26 on the basis of the absence of switch control signal 62 and playback is continued. The alternative frequencies obtained by then as a result of the transmitter search run are stored in memory 28, for example, sorted according to their reception quality, and they are sorted according to their PI code as a higher-level sorting criterion.

If sufficient receivable alternative frequencies are available, then at first no other activities of the control unit are provided, so that no enable signal 66 is generated. Additional interruptions in playback are thus suppressed even in the case of detected modulation or speech pauses.

For the case when, in the course of the terminated search run stage, the number of alternative frequencies determined is inadequate, the search run may be continued at point in time 719 of a subsequent speech pause using the transmission frequency set last as part of the search run.

Furthermore, in the case of longer music broadcasts, i.e., sections in which the M/S bit continuously indicates playback of a music signal, longer playback interruptions are allowed if necessary to guarantee, or at least make more probable, satisfactory functioning of the radio receiver according to the present invention. To do so, the goals to be achieved of both uninterrupted radio playback and satisfactory functioning of the radio receiver are prioritized appropriately. Although it is desirable to play back the received radio signal without interruption as much as possible, it is also necessary to ensure that switching to alternative frequencies, for example, occurs only to alternative frequencies that have a minimum reception quality to guarantee undisturbed playback as much as possible, which requires regular maintenance of AF memory 28, however.

It should be noted that, although the exemplary embodiment of the present invention described above concerns only one possible implementation, the present invention is not limited to this approach. Instead, alternative embodiments are also feasible for implementation of the idea on which the present invention is based, although they will not be discussed further here.

What is claimed is:

1. A method of masking an interruption in a playback of a received radio signal, the method comprising:

allowing lengthy interruptions in the playback only if a modulation of the playback of the received radio signal is recognized as speech and a modulation pause in the received radio signal is detected.

2. The method according to claim 1, further comprising:

analyzing an identifier characterizing speech contributions to recognize speech.

3. The method according to claim 2, wherein the identifier includes a music/speech identifier transmitted via a Radio Data System.

4. The method according to claim 1, further comprising:

detecting the modulation pause if a modulation level drops below a specified threshold value.

5. The method according to claim 4, wherein the specified threshold value is a fixed value.

6. The method according to claim 4, wherein the threshold value is a function of a current reception quality of the received radio signal.

7. The method according to claim 1, further comprising:

cancelling the interruption in the playback of the received radio signal upon detecting an end of the modulation pause.

8. The method according to claim 7, further comprising:

detecting the end of the modulation pause if a modulation level rises above a specified threshold value.

9. The method according to claim 8, wherein the specified threshold value is a fixed value.

10. The method according to claim 8, wherein the threshold value is a function of a current reception quality of the received radio signal.

11. The method according to claim 1, further comprising:

cancelling the interruption of the playback of the received radio signal after a specified period of time.

12. The method according to claim 1, further comprising:

prematurely terminating the interruption of the playback of the received radio signal if activities to be performed during the interruption have been concluded.

* * * * *

UNITED STATES PATENT AND TRADEMARK OFFICE
CERTIFICATE OF CORRECTION

| | |
|---|---|
| PATENT NO. | : 6,961,548 B2 |
| APPLICATION NO. | : 10/182411 |
| DATED | : November 1, 2005 |
| INVENTOR(S) | : Groeger et al. |

It is certified that error appears in the above-identified patent and that said Letters Patent is hereby corrected as shown below:

Column 3, line 52, change "a Fixed interruption duration" to -- a fixed interruption duration --

Column 5, line 45, change "MIS bit" to -- M/S bit --

Signed and Sealed this

Eighteenth Day of March, 2008

JON W. DUDAS
*Director of the United States Patent and Trademark Office*